(12) United States Patent
Gray

(10) Patent No.: US 6,543,024 B2
(45) Date of Patent: Apr. 1, 2003

(54) WRITE FORMAT FOR DIGITAL DATA STORAGE

(75) Inventor: Martin D. Gray, La Jolla, CA (US)

(73) Assignee: Overland Storage, Inc., San Diego, CA (US)

( * ) Notice: Subject to any disclaimer, the term of this patent is extended or adjusted under 35 U.S.C. 154(b) by 271 days.

(21) Appl. No.: 09/746,876

(22) Filed: Dec. 22, 2000

(65) Prior Publication Data

US 2001/0052101 A1 Dec. 13, 2001

Related U.S. Application Data

(63) Continuation of application No. 09/133,982, filed on Aug. 14, 1998, now Pat. No. 6,167,550, which is a continuation of application No. 08/599,149, filed on Feb. 9, 1996, now Pat. No. 5,815,514.

(51) Int. Cl.$^7$ ............................................. G11C 29/00
(52) U.S. Cl. ...................................... 714/769; 714/701
(58) Field of Search ................................ 714/809, 769, 714/701, 768, 703, 775; 341/58, 109; 370/474, 463; 382/306; 360/26, 48

(56) References Cited

U.S. PATENT DOCUMENTS

| | | |
|---|---|---|
| 3,689,899 A | 9/1972 | Franaszek |
| 4,435,826 A | 3/1984 | Matsui |
| 4,556,983 A | 12/1985 | Heitmann et al. |
| 4,559,568 A | 12/1985 | Watanabe et al. |
| 4,680,791 A | 7/1987 | Kato et al. |
| 4,712,217 A * | 12/1987 | McPherson .................. 714/809 |
| 4,731,676 A | 3/1988 | Berlekamp |
| 4,736,377 A | 4/1988 | Bradley et al. |
| 4,744,082 A | 5/1988 | Fujimura et al. |
| 4,779,275 A | 10/1988 | Yoshimoto |
| 4,862,457 A | 8/1989 | Morimoto |
| 4,907,225 A | 3/1990 | Gulick et al. |
| 4,908,826 A | 3/1990 | Hertrich |
| 4,978,955 A | 12/1990 | Howell |
| 4,993,029 A | 2/1991 | Galbraith et al. |

(List continued on next page.)

FOREIGN PATENT DOCUMENTS

| | | |
|---|---|---|
| EP | 0 310 057 A2 | 4/1989 |
| EP | 0 343 930 A2 | 11/1989 |
| EP | 0 347 934 A2 | 12/1989 |
| EP | 0 507 196 A2 | 10/1992 |
| EP | 0 511 498 A2 | 11/1992 |
| EP | 0 593 173 A2 | 4/1994 |
| EP | 0 597 443 A1 | 5/1994 |
| EP | 0 691 750 A1 | 1/1996 |
| GB | 2 286 952 | 8/1995 |
| JP | 06124451 | 5/1994 |
| JP | 07111047 | 4/1995 |
| WO | WO 87/06086 | 10/1987 |
| WO | WO 93/10534 | 5/1993 |
| WO | WO 94/07332 | 3/1994 |
| WO | WO 97/29486 | 8/1997 |

OTHER PUBLICATIONS

Price, R., et al., "An Experimental, Multilevel, High Density Disk Recording System," IEEE Transactions On Magnetics, vol. Mag–14, No. 5, Sep. 1978.

XP–000759657, IBM Technical Disclosure Bulletin, vol. 28, No. 3, Aug. 1985, pp. 1063–1064.

Roth, Disk Recording, Mass Storage Gets New Boost, "Higher–efficiency encoding schemes for disk storage devices can offer more bits and fewer errors at little or no extra cost", Electronics Week, Apr. 8, 1985, pp. 55–59.

*Primary Examiner*—David Ton
(74) *Attorney, Agent, or Firm*—Knobbe Martens Olson & Bear LLP

(57) ABSTRACT

A digital data recording channel which uses variable rate encoding. The encoder monitors an input bit stream for sequences associated with selected readback characteristics, and inserts one or more bits where desirable to improve the characteristics of the stored bit stream.

29 Claims, 11 Drawing Sheets

U.S. PATENT DOCUMENTS

| | | |
|---|---|---|
| 5,014,274 A | 5/1991 | Higurashi et al. |
| 5,068,878 A | 11/1991 | Lin et al. |
| 5,109,385 A | 4/1992 | Karp et al. |
| 5,151,699 A * | 9/1992 | Moriyama .................. 341/58 |
| 5,172,381 A | 12/1992 | Karp et al. |
| 5,222,139 A | 6/1993 | Takaragi et al. |
| 5,255,131 A | 10/1993 | Coker et al. |
| 5,325,370 A | 6/1994 | Cleveland et al. |
| 5,345,342 A | 9/1994 | Abbott et al. |
| 5,384,560 A | 1/1995 | Yamasaki |
| 5,404,377 A | 4/1995 | Moses |
| 5,438,460 A | 8/1995 | Coker et al. |
| 5,528,607 A | 6/1996 | Weng et al. |
| 5,534,944 A | 7/1996 | Egawa et al. |
| 5,566,208 A | 10/1996 | Balakrishnan |
| 5,570,379 A | 10/1996 | Sasaki et al. |
| 5,579,324 A | 11/1996 | Buhrgard |
| 5,629,983 A | 5/1997 | Fujimoto |
| 5,703,915 A | 12/1997 | Vergnes et al. |
| 5,712,863 A | 1/1998 | Gray |
| 5,771,239 A * | 6/1998 | Moroney et al. ........... 370/474 |
| 5,815,514 A | 9/1998 | Gray |
| 5,862,270 A * | 1/1999 | Lopresti et al. ............. 382/306 |

\* cited by examiner

WRITE FORMAT FOR DIGITAL DATA STORAGE

RELATED APPLICATIONS

This application is a continuation of, and claims priority to U.S. patent application Ser. No. 09/133,982, entitled "WRITE FORMAT FOR DIGITAL DATA STORAGE" and filed on Aug. 14, 1998, now U.S. Pat. No 6,167,550, which application is a continuation and also claims priority to patent application Ser. No. 08/599,149, entitled "VARIABLE RATE BIT INSERTER FOR DIGITAL DATA STORAGE", filed on Feb. 9, 1996, now U.S. Pat. No. 5,815,514. The disclosures of each of the above mentioned issued patent and patent application are hereby incorporated by reference in their entireties.

BACKGROUND OF THE INVENTION

1. Field of the Invention

The invention relates to data encoding in data storage recording channels. In some advantageous embodiments, the invention relates to data encoding suitable for subsequent partial response decoding in a magnetic storage environment.

2. Description of the Related Art

Variable-rate bit insertion techniques are well known as a method for assuring clock synchronization of the data stream. Typically, this method has application in the communication field, although variable rate bit insertion has been used in other applications, as is well known in the art. According to this technique, data bits are inserted into selected portions of a data stream where there is an increased likelihood that an error will be made in detecting the data bits accurately at this portion of the data stream. For example, variable-rate bit insertion may be used in a communications system where the receiving decoder is self-clocked. It is important that long strings of ones or zeros be broken up so that the phase locked loop at the detector side does not lose phase lock on the clock rate at which the data is being transmitted. This is particularly important in applications involving reading, for example, from magnetic tape since tape storage media typically have a very uncertain speed profile so that frequent clocking information is preferable to maintain phase lock. Thus, in such applications where it is desirable to maintain phase lock at the reading or receiving side, data bits are intentionally inserted into "trouble regions" within the output data stream so that at the detector side, sufficient information is present in the received data signal to maintain accurate phase lock on this data signal so that the data stream can be properly decoded.

Although the method of variable-rate bit insertion is desirable as an inexpensive and fairly simple method of increasing the robustness of data against errors, such a method has typically been found to be impractical in other applications. Most notably, variable-rate bit insertion has had limited applicability in the magnetic recording environment. Magnetic recording typically involves storage onto a tape or a disk, where data is stored to the magnetic tape or disk first and then read back. To provide for robust storage of data, variable rate bit insertion might be used to encode the data before writing to the magnetic media, and when the data is read back, the inserted bits would be detected and discarded. However, since the actual number of bits which are to be inserted is highly unpredictable, it is possible that the number of bits inserted would extend the length of the data stream by as much as 10 to 12 percent. Such an extension of the data stream is unacceptable for purposes of data storage, especially when it is desirable to maximize data storage efficiency. For example, if a particular data stream has characteristics such that a bit insertion is called for every 10 bits, then the amount of data to be stored onto the magnetic media will increase by 10 percent. This effectively makes a 500-megabyte storage media into a 450-megabyte storage media.

In an effort to transform the data stream into a form that is amenable to variable-rate bit insertion, the incoming data stream is first randomized using, for example, a pseudo-random noise code which is exclusive ORed with the incoming data stream to give the resulting output a random or pseudo-random character. This random character ensures that the probability of a data stream being extended by more than 1 percent, for example, is statistically negligible. This is because bit insertion is typically performed to break-up regular patterns so that a substantially random pattern will require very few bit insertions. Thus, by randomizing the data before applying the variable-rate bit insertion techniques, such techniques can be more readily applied in applications involving data storage on magnetic or other data storage media.

It has been found, however, that in certain instances, when the incoming data pattern has a characteristic that correlates with the pseudo-random code in such a way as to produce undesirable encoded characteristics (e.g., long strings of ones or zeros, or other redundant patterns), the randomization of the data stream using that particular pseudo-random code does not act to prevent the length of the inserted data bits from being prohibitively long. A data stream having this characteristic is typically referred to as a degenerate pattern. Thus, when the incoming data stream is degenerate, variable-rate bit insertion techniques are not practical for use with magnetic storage or other data storage media. Furthermore, simply the possibility of such a degenerate data pattern has generally been considered as an impediment to the use of variable-rate bit insertion in the data storage environment.

In addition to the aforementioned shortcomings of variable-rate bit insertion in the data storage applications, it has been found that conventional techniques of variable-rate bit insertion do not always ensure that errors on the receive side associated with loss of phase information and automatic gain control are alleviated. For instance, if a detected data stream has characteristics such that a maximum swing in amplitude is not observed for a long period of time, this can cause the automatic gain control at the detection side to lose tracking, thereby introducing amplitude errors into the detected signal. Furthermore, loss of phase lock may result from data patterns other than consecutive strings of zeros and ones. Accordingly, simply inserting a bit in long strings of zeros and ones does not ensure that phase lock will be maintained in a self-clocking system at the decoding side. Thus, a need exists for an improved data encoding method which resolves the difficulties associated with variable-rate bit insertion in data storage applications and also accounts for receive-side errors associated with miscalibration of the automatic gain control or phase lock loop.

SUMMARY OF THE INVENTION

The invention includes methods for writing data to a data storage medium. In one embodiment, the method comprises receiving an input data stream and detecting one or more bit sequences associated with a small amplitude read signal during readback from the data storage medium. The method may be continued by inserting one or more bits into the input data stream in response to the detection, whereby the inserted bits extend the length of the input data stream by a variable amount which depends on the input data stream content. The method may be concluded by writing the data stream including the inserted bits to the data storage medium.

Alternatively, the method may include detection of one or more bit sequences associated with a slowly varying readback read signal, with a maximum amplitude readback read signal, or with a data block preamble sequence. Two or more of these detecting acts may be performed at the same time.

Apparatus for variable rate encoding are also provided. In one embodiment, a data encoder comprises an input port for serially receiving a sequence of bits, a code follower having a plurality of previously received bits as inputs, and at least one register storing a value. The value is updated in response to the plurality of previously received bits. A bit inserter is also provided, the bit inserter inserting one or more bits into the received sequence of bits in response to the value.

DETAILED DESCRIPTION OF THE PREFERRED EMBODIMENT

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention.

Figure 1:
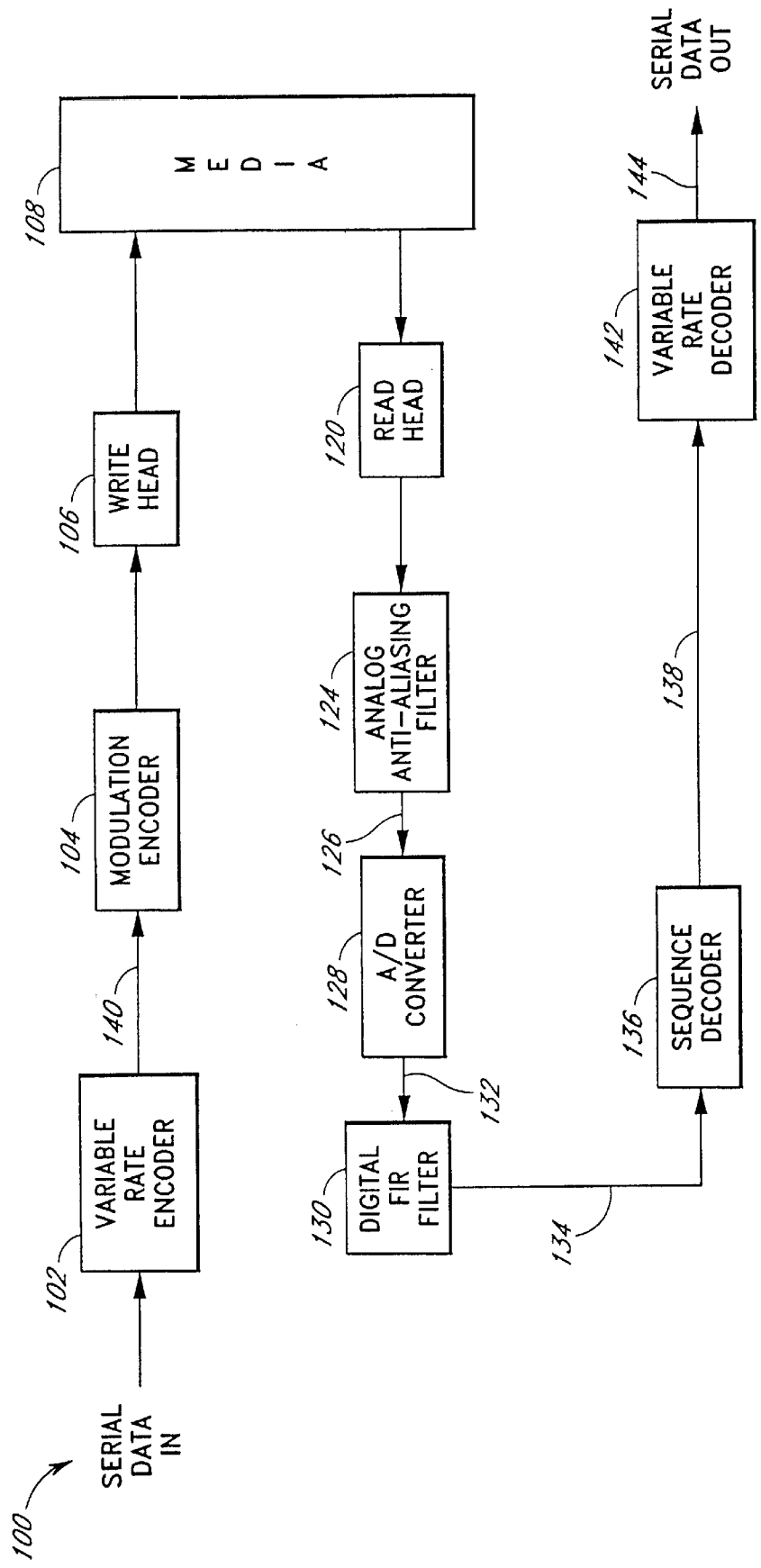
FIG. 1 is an overall system diagram that illustrates read and write channels associated with data storage on a data storage media.

FIG. 1 illustrates a block diagram of a data storage recording channel. The input to the recording channel is a serial stream of binary digits 100 representing data to be stored on a magnetic medium. The incoming bit stream 100 is formatted and encoded by a variable rate encoder 102. As will be described in detail below, the encoding at block 102 includes variable rate run-length limited encoding to help ensure, among other things, adequate phase and amplitude content in the read signal produced by the recorded bit stream when the data is subsequently retrieved from the data storage media. Run length limited codes may be characterized in part by a code constraint (n,k), where n denotes the minimum distance between 1s, and k denotes the maximum number of consecutive zeros. Run length limited codes having a low value for n are therefore more efficient. As will be described below, the encoding technique performed by the variable rate encoder 102 may advantageously comprise a (0,k) code which provides for high data density, while maintaining adequate phase and amplitude content in the recorded bit stream.

Following formatting and encoding at block 102, the encoded bit stream is then translated into a modulated write current by a modulation encoder 104 which drives an inductive write head 106 in close proximity to a magnetic media 108 such as a magnetic disk or magnetic tape. Various forms of modulation coding are known in the art and may be used, such as the NRZ-M modulation format (write current reversal at every "1" in the bit stream).

During read out of the media 108 stored data, a read head 120, which may be inductive, magnetoresistive, or any other field sensing transducer, produces a read voltage or current output which varies as the head passes over magnetic transitions previously laid on the media 108 by the write head 106. The signal from the read head 120 then is passed to the input of an analog low pass anti-aliasing filter 124. The analog filter 124 outputs a filtered analog read signal at node 126. A flash analog to digital converter 128 periodically samples the analog read signal present at node 126, and a FIR filter 130 receives the digitized amplitude values at node 132, and digitally filters the sampled values according to a desired spectral shape.

The output of the filter 130 provides the input at node 134 to a sequence decoder 136, which translates the sequence of filtered digital samples present at node 134 into a decoded serial bit stream which is output at node 138. The data stream at node 138 is then fed to a variable rate decoder 142 which among other things detects and removes added bits which were inserted by the variable rate encoder 102 during the write process, thereby reproducing the original data stream 100 at output node 144.

Of course, the serial data stream output at node 144 is ideally identical to the serial data input stream 100 input to the system during the write process, but timing and gain errors, noise, signal dropouts, and other error sources invariably introduce a certain bit error rate in the output at node 144. These errors may be correctable by the error correction encoding scheme used, but reductions in the raw number of errors present at node 144 are desirable. In accordance with the invention, timing and gain errors are reduced in an efficient low overhead manner by coding the data sequence in a manner which helps ensure that the read signal contains sufficient amplitude and phase content. It is one aspect of the invention that the variable rate encoder 102 inserts bits into the incoming data stream 100 to help ensure that the samples at node 132 which are being filtered and interpreted can be appropriately amplified and can be obtained at sampling times which are in a proper phase relationship with the transitions on the media 18 being detected.

In the specific embodiment described below with reference to FIGS. 8–11, the variable rate encoder 102 inserts bits which produce a recorded bit stream having characteristics which are advantageous for interpretation by an Extended Class IV partial response (EPR4) read channel. In the case of EPR4 partial response signaling the filter 130 may comprise a digital bandpass filter with a peak near ¼ the nominal bit rate of the data stream being read off of the magnetic media 108, and the sequence decoder 136 may comprise a viterbi partial response, maximum likelihood decoder. It will be appreciated, however, that the principles of the present invention may be applied to produce data write formats adapted for other read channel designs.

Figure 2:
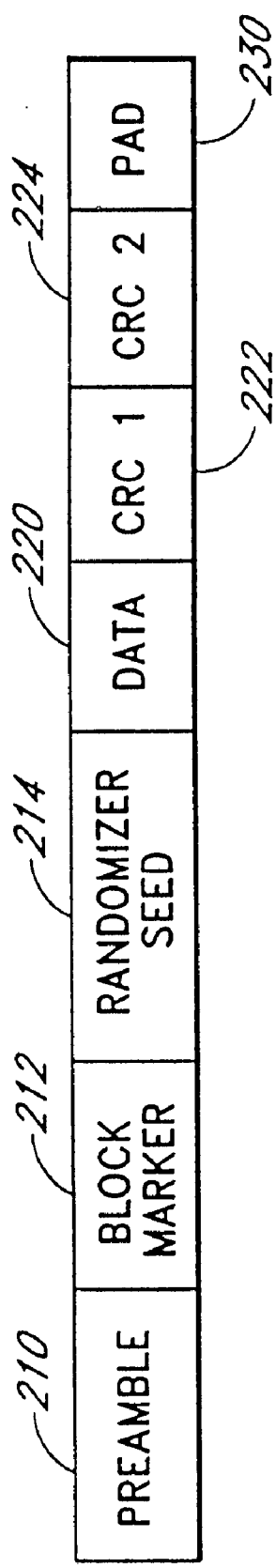
FIG. 2 schematically illustrates the format of a data block in one preferred embodiment of the invention.

FIG. 2 schematically illustrates a format of a data block assembled by the variable rate encoder 102 for storage to the media 108 in one embodiment of the invention. The overall block format is application specific and may vary widely. As shown in FIG. 2, each data block includes a preamble segment 210, a block marker 212, a randomizer seed or code 214, a data portion 220, a cyclical redundancy check (CRC) portion 222 and 224, and a pad 230. The preamble 210 typically comprises a four-byte segment which is used to identify the beginning of a new data block. The preamble bit sequence is selected to produce a read head response during the subsequent read process that is easy for the read channel to acquire phase lock with in preparation for decoding the data that follows. In one embodiment described in additional detail below, the preamble 210 comprises four sequential copies of the byte 00110011. This preamble sequence is designed to produce a large read channel response in an Extended Class IV (EPR4) partial response read channel. The block marker 212 marks the transition out of the preamble segment, and may comprise the two bits 11.

Following the block marker 212, a randomizer seed 214 used to randomize the data 220 portion of the block is present. The randomizer seed may advantageously comprise a three byte (24 bit) sequence which is non-deterministically selected for each data field. During the write process the randomizer seed portion 414 of the block may remain unrandomized, or it may be randomized using a fixed seed which is not stored on the media. To reduce the likelihood of read errors when reading the seed portion 214 of the data block, the seed 214 may be further encoded using the variable rate encoding scheme set forth herein. This embodiment is used as an example in the discussion associated with FIGS. 8–11 below. Alternatively, it may be advantageous to use a higher overhead encoding scheme for the seed field 214 than the data field 220. For example, the randomizer seed field 214 could be encoded using a fixed ⅘ or ⅚ code. This is less efficient than the variable rate insertion code used on the data 220 and CRC portions 222, 224 of the block, but it provides a better assurance of readability in the absence of randomization. As another alternative, the variable rate bit insertion can be performed on the seed field 214, but with different bit insertion thresholds for null sequence length, phase content, and amplitude variations than are utilized when writing the data field 220 to better ensure adequate read characteristics for the randomizer seed.

The data field 220 contains data for storage on the media 108 which will be randomized using the randomizing polynomial and randomizer code and also variable rate encoded with appropriate bit insertions as is described below with reference to FIGS. 8–11. This data field 220 may vary in length. In one specific embodiment, the data field 220 length is selectable from zero to 16,383 bytes in length. As the data field 220 will also include bits inserted during the variable rate encoding process, the total length of the data field 220 will vary depending on the content of the data to be stored.

The CRC segment 222, 224 advantageously comprises a six byte field calculated from the randomizer seed 214 and data 220 fields prior to randomization. The CRC fields 222, 224 may also be error encoded with the variable rate bit insertion methods described below. Thus, the CRC fields 422, 424 may total more than 48 bits in length.

As shown in FIG. 2, in one advantageous embodiment, the CRC segment is broken into two independent CRC fields, a 17 bit CRC field 222, and a 31 bit CRC field 224. The polynomial used to calculate the 17 bit CRC field may be:

$$g(x)=x^{17}+x^{15}+x^{14}+x^{13}+x^{11}+x^9+x^6+x^5+x^4+x^3+1$$

The polynomial used to calculate the 31 bit CRC field may be:

$$g(x)=x^{31}+x^{27}+x^{23}+x^{19}+x^{15}+x^{11}+x^{10}+x^9+x^7+x^6+x^5+x^3+x^2+x+1$$

With two independent CRC fields 222, 224, most errors will be flagged by the 17 bit CRC check in time for the system to complete a signal reacquisition prior to beginning a read of the data in the next block. Error detection with a single 48 bit CRC field requires a longer time period, and the system will typically be processing the next block of data before the error condition is flagged. Signal reacquisition to help prevent further read errors of subsequent data blocks therefore takes place over the next block, and at least two blocks must typically be discarded to recover from a CRC error originating in one block.

The pad field 230 comprises a one, two or three bit field which has the length required to make the randomizer seed, data, CRC fields, and pad together comprise a modulo-4 bit count. In advantageous embodiments utilizing an EPR4 read channel as described above, one, two and three bit pads comprise 1, 11, and 011 respectively. In multi-channel systems, the pad 230 for a block being processed in one channel may be further extended with copies of the word 0011 until one or more other channels complete the writing of the pad field and the blocks are synchronized across the separate channels. Following the pad 230, the preamble sequence for the next block is begun. Like the preamble 210 and block marker 212 sequences, the pad 230 is advantageously not randomized or variable rate encoded.

Figure 3:
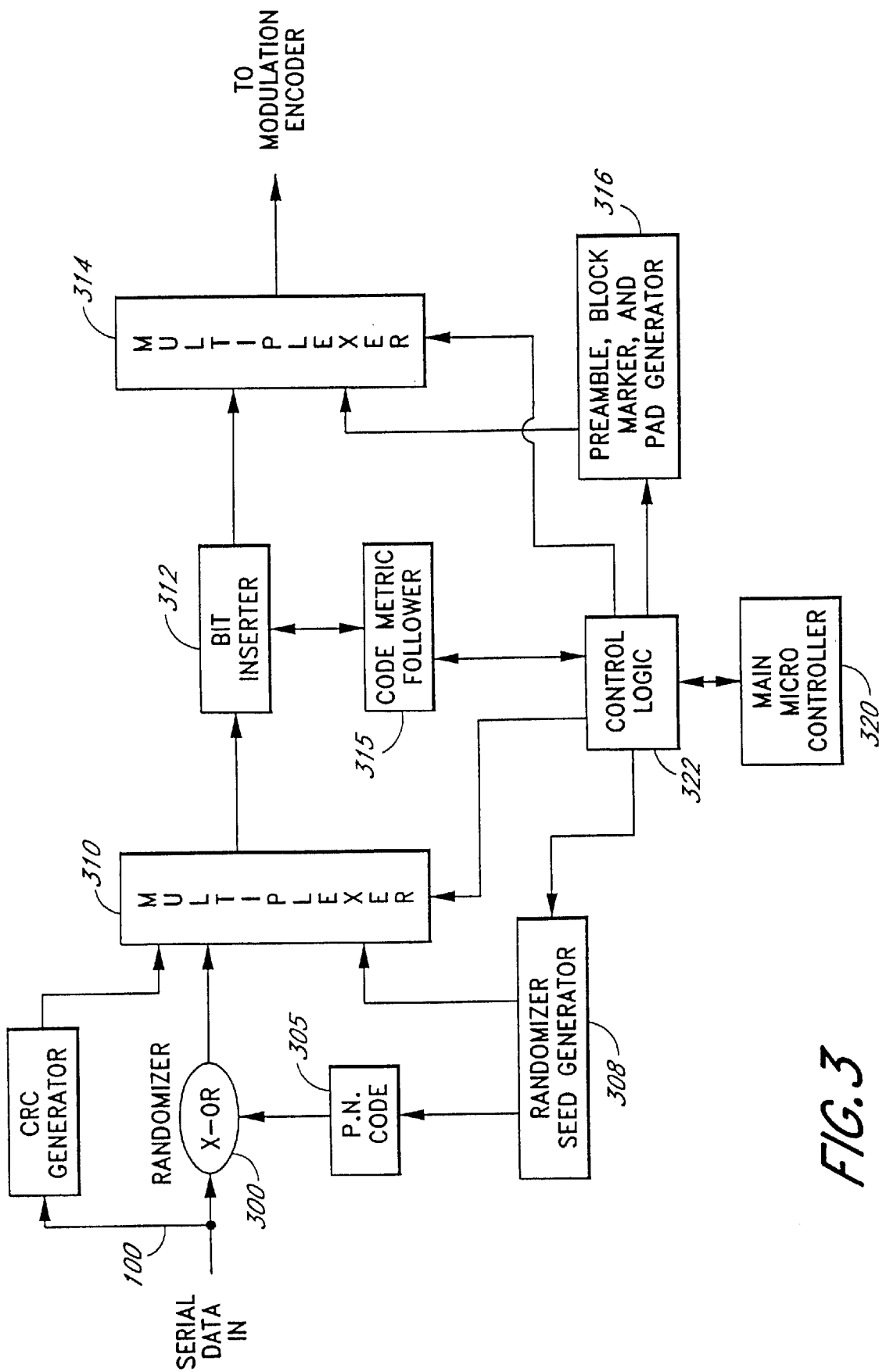
FIG. 3 is a simplified block diagram that illustrates the main functional elements of the variable rate encoder of FIG. 1.

FIG. 3 is a schematic block diagram that illustrates the main functional elements of the variable rate encoder 102 of FIG. 1. As mentioned above, the variable rate encoder shown in FIG. 3 may advantageously be provided in a disk or tape drive. As shown in FIG. 3, a data pattern input 100 enters a randomizer 300. In one preferred embodiment, the randomizer 300 comprises an exclusive OR gate, which receives the input data pattern on a first input and receives a pseudo-random noise code via a second input from a pseudo-noise code generator 305. As will be described in greater detail below, the pseudo-noise code generator 305 comprises a shift register and adder configuration, which is defined by a randomizer polynomial. Of course, it will be appreciated that the randomization of data using a linear feedback shift register (LFSR) is well understood and conventional. In one embodiment, the polynomial defining the randomizer configuration is:

$$g(x)=x^{24}+x^{21}+x^{19}+x^{18}+x^{17}+x^{16}+x^{15}+x^{14}+x^{13}+x^{10}+x^9+x^5+x^4+x+1$$

The pseudo-random sequence generated by the LFSR and output to the exclusive OR gate 300 is determined by both the randomizer polynomial set forth above which defines the tap positions and other aspects of the LFSR as well as by the initial state of the bits stored by the LFSR. These initial bits define a randomizer code, also referred to as a randomizer seed. By setting the initial values of the pseudo-noise code generator register (i.e., the randomizer code), the pseudo-noise sequence that is generated by the generator 305 can be reconfigured so that the pseudo-noise sequence can easily be changed on the fly (e.g., in between data blocks). Randomizer codes may be created using dedicated randomizer seed generator logic 308, or may be created using the microcontroller 320 typically provided as a part of the data storage device such as the tape or disk drive utilizing the recording channel herein described. Advantageous processes for generating and storing the randomizer codes are set forth in detail with reference to FIG. 5.

The output of the randomizer 300 feeds a multiplexer 310, which has as a second input an output from randomizer seed generation circuitry 308. The multiplexer also has a third input from CRC generation circuitry. The multiplexer 310 is controlled so as to help produce the block format described above with reference to FIG. 2.

The output of the multiplexer 310 feeds a bit inserter 312. The bit inserter 312 comprises a variable rate bit inserter which inserts bits into an input bit stream to increase the phase and amplitude content of the data stream to reduce the read channel error rate. This bit insertion is directed by a code metric follower 315 described in more detail in conjunction with FIGS. 7–11. The output of the bit inserter 312 is provided to a second multiplexer 314 having a second input from preamble, block marker, and pad generator circuitry 316. As with the first multiplexer 310, the second multiplexer also operates to help create the data block format illustrated in FIG. 2. The output of the second multiplexer 314 is routed to the modulation encoder 104 of FIG. 1.

In operation, the main microcontroller 320 provides a write initiation signal to encoder control logic 322. The control logic 322 instructs the preamble, block marker, and pad generator circuitry 316 to generate a preamble and block marker sequence, and this sequence is selected for output to the modulation encoder via the second multiplexer 314. Also, a randomizer seed is generated by the randomizer seed generator circuitry 308, and this randomizer seed is fed to the first multiplexer 310, and is selected for output to the bit inserter 312.

The multiplexer 310 output is monitored by the code metric follower 315, which determines whether or not the data stream meets metric criteria defined to minimize the likelihood of decoding error. When the code metric follower 315 determines that a bit is to be inserted within the data stream, the appropriate bit is inserted by the bit inserter 312. In the embodiment described in detail below with reference to FIGS. 7–11, the insertion comprises a single bit having a polarity which depends on a previously received bit in the data stream. Alternatively, a multiple bit word (i.e., having two, three, four or more bits) could be inserted as called for by the specific application. When the encoded randomizer seed is output from the bit inserter 312, the second multiplexer 314 is configured to pass the bit inserter output to the modulation encoder for writing to the media 108. Thus, the randomizer seed is variable rate encoded and written to the media immediately following the preamble and block marker.

Following randomizer seed routing through the multiplexer, the data to be stored 220 is forwarded to the randomizer 300 for randomization using the seed generated by the generator circuitry 308 and just stored to the media 108. The data is also routed to the CRC generator circuitry 309 so that the CRC fields 222, 224 can be computed. At this time, the multiplexer 310 is configured to pass the randomized data to the bit inserter 312 for variable rate encoding. The encoded data output from the bit inserter 312 to the second multiplexer 314 is then passed to the modulation encoder for writing to the media 108.

After the data field 220 is fed through the multiplexer 310, the multiplexer 310 is configured to pass the calculated CRC fields to the bit inserter 312, which are also variable rate encoded and passed through the second multiplexer 314 to the modulation encoder for writing to the media 108. Finally, the pad field 230 is generated based on the bit count of the whole block, and is routed from the preamble, block marker, and pad generator circuitry 316 through the multiplexer 314, and to the media 108. Thus, with the proper timing of the multiplexers 310, 314 and the other data transfer and encoding circuitry of FIG. 3, the block format of FIG. 2 is written to the media.

Figure 4:
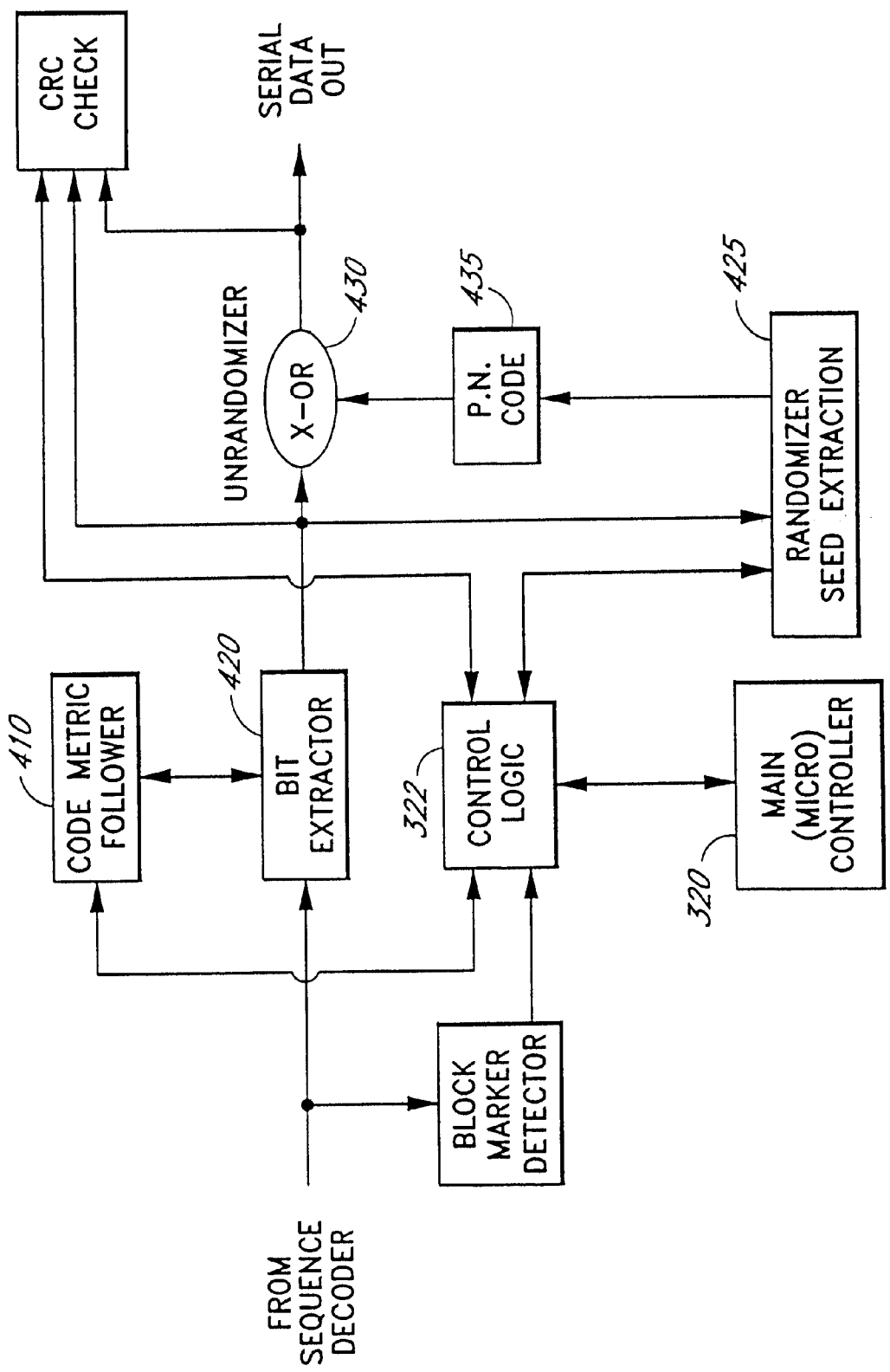
FIG. 4 is a simplified block diagram that illustrates the main functional elements of the variable rate decoder of FIG. 1.

FIG. 4 is a schematic block diagram which illustrates the main functional elements of the variable rate decoder 142 of FIG. 1. It will be appreciated that the basic function of the variable rate decoder 142 is to undo the bit insertions and randomization performed by the variable rate encoder 102 so as to reconstruct the original serial bit stream 100. Accordingly, the code metric follower 410 of FIG. 4 analyzes the incoming bits in substantially the same manner as the code metric follower 315 of FIG. 3. The code metric follower 410 monitors the data stream output by the sequence decoder 136 and generates command signals for a bit extractor 420. When the code metric follower 410 in the decoder detects a pattern that indicates that the next bit is a bit inserted by the variable rate encoder 102 during the write process, the bit extractor 420 removes the inserted data bit and at the same time verifies that the extracted bit is of the expected polarity. If the polarity is incorrect, an error status signal is generated to inform the microcontroller 320 via the control logic 322.

Prior to decoding the data field 220 of a formatted block, the preamble and block marker must be detected to determine the appropriate starting points for bit extraction and un-randomization. Accordingly, data from the sequence decoder is routed to both the bit inserter 420 and to preamble and block marker detection circuitry 402. When this detection circuitry detects the block marker following the preamble, the bit extracter 420 and code metric follower are initialized to their start states described with reference to FIGS. 8–11.

The first 24 bits output from the bit extracter 420 following the block marker will be the stored randomizer seed 214. These first 24 bits are detected and stored in randomizer extraction circuitry 425. The extracted randomizer seed 214 is forwarded to the pseudo-noise code generator 435 for unrandomization of the data field 220.

After the randomizer seed 214 is processed, the next field received from the sequence decoder is the data field 220. Following the extraction of inserted bits, the data is passed to the unrandomizer 430, where the data is exclusive ORed with the appropriate pseudo-noise sequence generated by the pseudo-noise sequence generator 435. The pseudo-noise sequence generator 435 is configured with the same polynomial set forth above with reference to the sequence generator 305 of FIG. 3, and is seeded with the 24 bit randomizer seed just extracted. Consequently, the same data pattern 100 which was initially written for storage to the media 108 is reproduced at the output of the unrandomizer 430. This original data sequence is also routed to CRC check circuitry 422.

After the data field 220 exits the bit extracter 420, the next output bit sequence is the 17 bit CRC value, followed by the 31 bit CRC value. As these sequences were not randomized initially, they are detected by the CRC check circuit 422 at the output of the bit extracter 420, prior to their entering the unrandomizer. The CRC check circuit then performs a 17 bit CRC check when the first CRC field is received, and a 31 bit CRC check when the 31 bit CRC is received. CRC errors are communicated to the microcontroller 320 via the control logic 322.

One aspect of the data coding technique set forth above is the randomization process. Data randomization is useful in these recording channels because data patterns that have an essentially random characteristic (i.e., data distribution) are statistically ideal for minimizing the number of data bits which must be inserted by the bit inserter 312 to break up bit patterns which increase the likelihood of a decoding error during readback of the data off of the medium 108.

In advantageous embodiments of the present invention, the randomizer code used to configure the pseudo-random sequence generator 305 is periodically changed in a non-deterministic manner. In these embodiments, the randomizer seed generator circuit 308 may be configured to comprise a randomizer code selector which non-deterministically selects randomizer codes for use by the pseudo-random code generator 305. Alternatively, the microcontroller 320 may be programmed for the non-deterministic selection of randomizer codes. Many techniques of non-deterministic number generation are known and would be suitable for use in the invention. Any procedure creating a complex, non-repetitive pattern for choosing consecutive codes can be used, as called for by the particular application. The non-deterministic character of the selection need only be sufficient to render the prediction of a sequence of randomizer codes impractical. It should also be noted that it is advantageous to be able to store data patterns which have been deliberately designed to anticipate changes in the randomizing sequence output by the pseudo-random code generator 305 (i.e., with the specific intent of producing a degenerate pattern). Thus, if a deterministic method of changing to new randomizer codes is used, it is still possible that such data streams will require an unacceptable number of bit insertions. Because the code bit sequence is not predictable with non-deterministic randomizer code selection, data streams which are intentionally encoded to frustrate data storage may still be randomized in such a way so as to reduce the average number of bit insertions per block to a tolerable level.

Several different implementations of data randomization are possible. In one advantageous embodiment shown in FIGS. 2–4, the randomizer code is non-deterministically changed for each data block written to the media, and the randomizer code used to randomize a given data block is stored in association with the data block so that it can be retrieved to de-randomize the data block when the data is later retrieved. When the randomizer code is changed with each data block, the coding efficiency remains high because only a statistically insignificant number of data blocks will contain a degenerate data pattern which requires a large number of bit insertions. Thus, the use of a plurality of non-deterministically variable randomizer codes will result in a bit insertion frequency which is within the allowable limits for storage on a magnetic medium. In one advantageous embodiment, each of the possible different randomizer codes ($2^n-1$ possibilities for an n-bit code) results in an orthogonal pseudo-noise sequence to that which was used on the last block of data. The reconfiguration to an orthogonal code ensures that the next block of data will not have a high correlation with the new pseudo-noise code. This is because orthogonal codes have an essentially zero correlation with one another so that, assuming that consecutive blocks of data have essentially the same bit pattern characteristic, when a bit pattern has a high correlation with a given pseudo-noise code, the same pattern will have a low correlation with a pseudo-noise code orthogonal to the original pseudo-noise code. Thus, by changing the randomizer code for the next block of data so that the new pseudo-noise code is orthogonal to the last pseudo-noise code, the number of insertions for the data bit stream can always be reduced beneath the threshold required for storage onto the media. In the randomization and bit insertion embodiments described herein, the average insertion rate may be maintained at under 1% regardless of data pattern.

Figure 5:
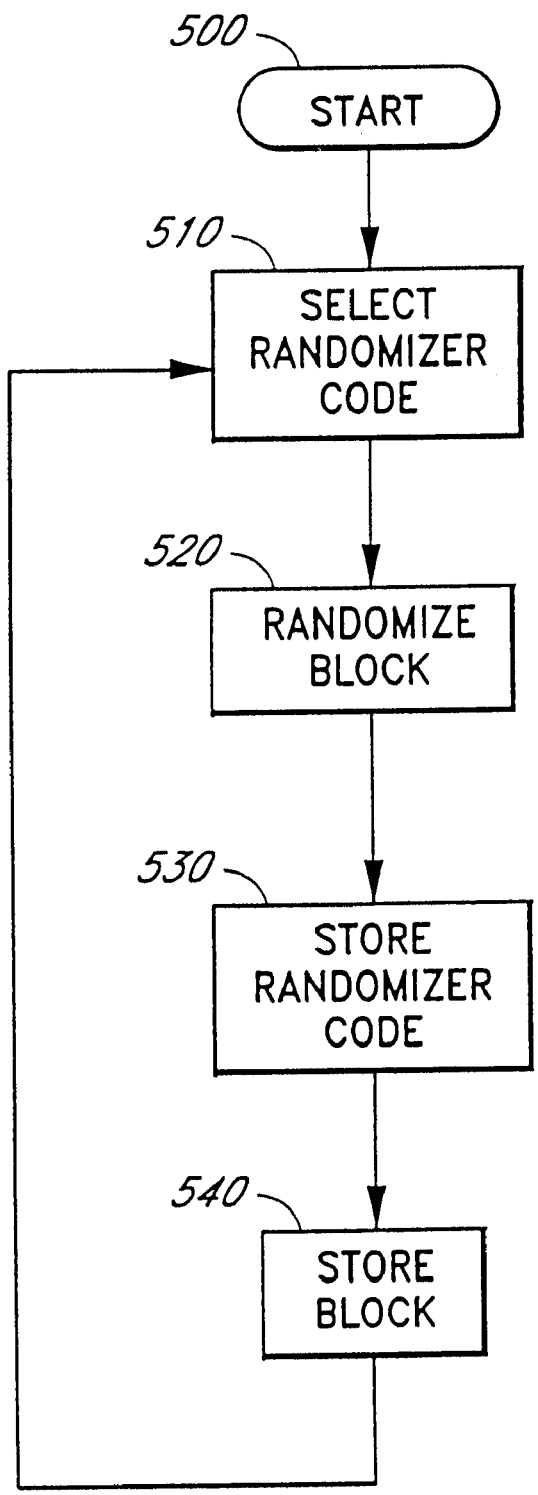
FIG. 5 is a flow chart illustrating the generation and storage of randomizer codes in one embodiment of the invention.

A general method for the generation and storage of randomizer codes according to one embodiment of the invention is illustrated in FIG. 5. The method initiates as represented within a start block 500. At step 510, when data is to be written to a magnetic media such as a disk or tape, a randomizer code is selected with which to randomize the block to be written. As mentioned above, this selection is preferably performed in a non-deterministic manner. As represented by block 520, the block is randomized with this randomizer code. When writing the data block to the media, at block 530 the randomizer code is stored, typically in a header portion of the data block. Also, at step 540, the data itself is stored on the media. After this data block is written, the system loops back to step 510, and selects a new randomizer code for use with the next data block. Once again, the selection is preferably performed in a non-deterministic manner, and the respective randomizer codes are stored on the media with the data itself. Non-deterministic selection of the randomizer code for each data block ensures that only an insignificant number of data blocks will require excessive bit insertions during a variable rate encoding process. It may also be noted that in this embodiment, it is not necessary to ensure that the randomizer code used for one particular block be different from the code used to randomize the prior block. With non-deterministic selection of a 24 bit randomizer code, identical randomizers for adjacent blocks will only occur about once every 16 million blocks.

It will also be appreciated by those of ordinary skill in the art that the steps of randomizing the block 520, storing the randomizer code 530, and storing the block 540 may be performed in any order. In many embodiments, data block randomization and storage are performed concurrently, as the data is stored as the randomized bits of the block are serially output from the randomizer.

Another alternative is available for preventing the storage of data with excessive insertions. The data pattern can be simultaneously fed to several encoder circuits, each using a different randomizer code. The output of the encoders is be routed to a buffer memory, where the randomized and encoded data block requiring the fewest insertions is selected for writing to the media, while the rest of the data blocks are discarded. It will be appreciated that when several randomized and encoded data sets are created, many alternative methods of selecting between them may be used. One alternative mentioned above is the selection of the data block incorporating the fewest insertions. Alternatively, one encoder may be a "primary" source of randomized and encoded data, unless the number of insertions exceeds a particular threshold, in which case a secondary encoder output is selected for writing to the media. If this secondary encoder output also includes excessive insertions, a third encoder output can be selected, and so on, until a data block of suitable length is found. The circuitry required to implement this scheme for, for example, four independent, alternative encoders is quite inexpensive. In this embodiment, non-deterministic selection of the plurality of randomizer codes is unnecessary. Rather, a plurality of fixed randomizer codes may be used. Data patterns which require an unacceptably high insertion rate for all randomizer codes used occur with a negligible frequency. It will be appreciated that periodic non-deterministic selection of new randomizer codes may also be performed with the multiple encoder embodiment. In this case, of course, the same microcontroller may be utilized to periodically generate all of the alternative randomizer codes.

Figure 6:
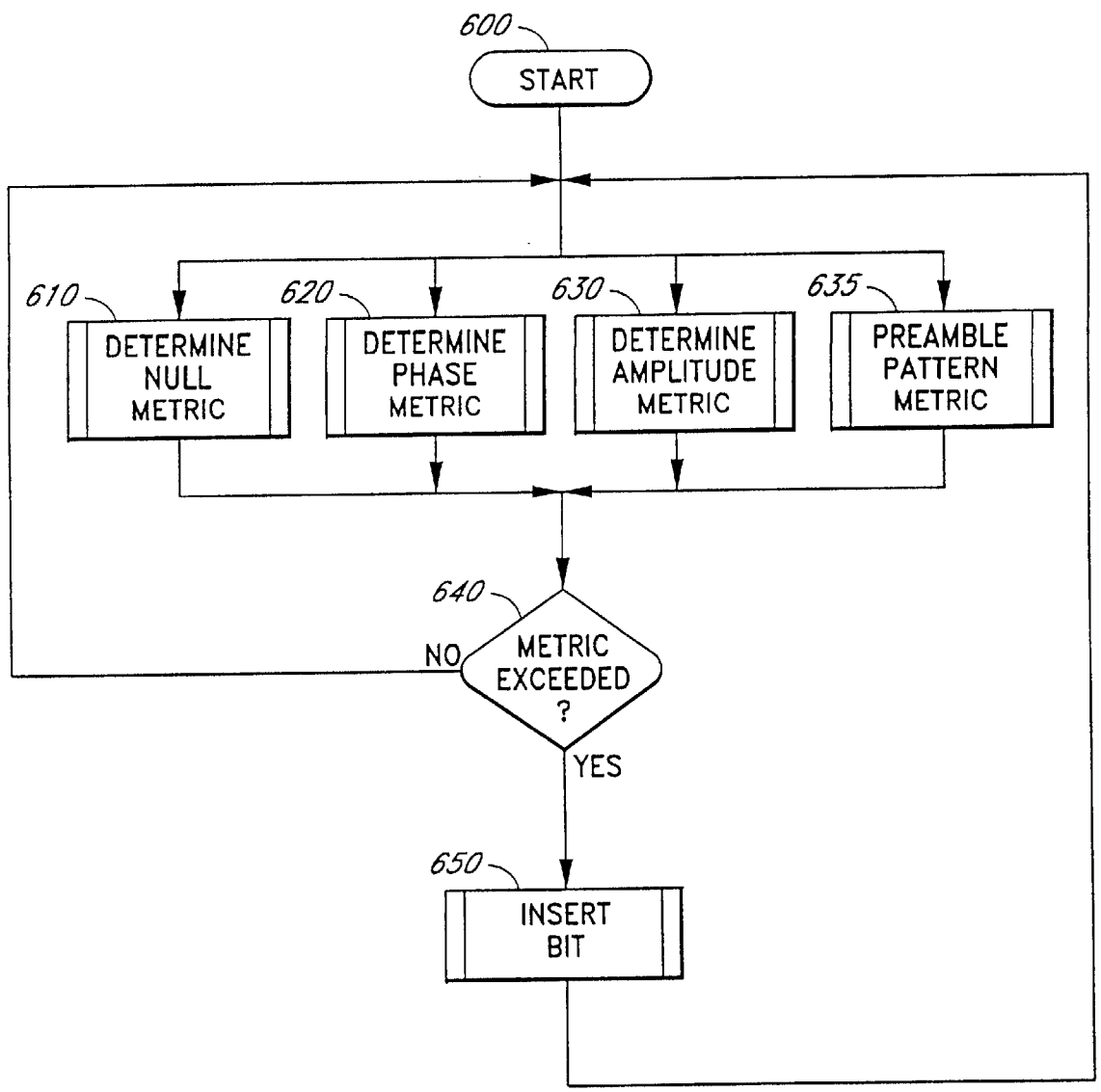
FIG. 6 is a flowchart that illustrates a general method used to insert a data bit in accordance with the variable-rate encoding method of the present invention.

Following data randomization as described above, bit insertion is performed by the bit inserter 312. FIG. 6 is a flowchart that illustrates the general method used in accordance with an embodiment of the present invention to insert data bits into the data field 220, CRC fields 222, 224, and the randomizer seed field 214 in accordance with an embodiment of the invention. As depicted in FIG. 6, the method initiates, as represented by a start block 600, and enters four metric subroutine blocks 610, 620, 630, 635 for parallel processing to determine a null metric, a phase metric, an amplitude metric, and a preamble pattern metric, respectively.

The null metric determined within the subroutine block 610, is used to detect data patterns such as strings of consecutive zeros, strings of consecutive ones, and other patterns which will produce a low read head response in the read channel utilized to read data from the media 108. As discussed briefly above, when a null pattern persists within the data stream for an extended period, the effects can be deleterious on the decoding so that errors are more likely to occur. Thus, the subroutine block 610 tabulates the length of a null pattern and outputs a flag or a metric value indicative of a null pattern. The method used within the subroutine block 610 to determine the null metric is described in greater detail below with reference FIG. 9.

As represented within the subroutine block 620, the phase metric of the incoming data stream is determined. The phase metric is an indication of the phase content of the data stream. Phase content is high for bit sequences which produce rapid variations in read signal amplitude, and is low for bit sequences producing slowly varying read signals. As discussed briefly above, it is important for a data stream to contain adequate phase content since data decoding requires amplitude measurements of the analog read signal having an appropriate phase relationship with the magnetization transitions on the media 108. Thus, as a measure of the phase content of the incoming data stream, the subroutine block 620 outputs a phase metric value. The method employed within the subroutine block 620 is described in greater detail below with reference to FIG. 8.

As represented within the subroutine block 630, the amplitude metric is also determined. For accurate sequence decoding, read signal samples which are decoded by the sequence decoder 136 (FIG. 1) should be maintained within an expected amplitude range. An automatic gain control (AGC) circuit is therefore typically provided to amplify the signal from the read head to the appropriate level. However, because the overall read signal level will shift due to variations in read head tracking, media characteristics, etc., the gain must be adjusted to compensate for these variations. The AGC circuit may be provided in the analog signal or may be digital in nature and be part of the sequence decoder 136. Systems may include fixed and variable amplification circuits in more than one location in the read channel as well.

To accurately trim the gain applied to the signal, it is particularly advantageous if the read signal occasionally undergoes a maximum amplitude variation while reading the data pattern. Thus, if the determination is made within the subroutine block 630 that a bit pattern producing maximum amplitude variation has not occurred within a determined interval, then an amplitude flag, or a measurement value indicating how long it has been since a maximum amplitude variation, is output by the subroutine block 630. The method employed within the subroutine block 630 to determine the amplitude metric is described in greater detail below with reference to FIG. 10.

In one particularly advantageous embodiment of the invention, the code metric follower 315 is also configured to monitor the seed 214 and data 220 portions of the block in order to ensure that the preamble pattern is not reproduced outside of a preamble field. The monitoring for the preamble pattern is performed within the subroutine block 635. If it is determined that a portion of the preamble has been reproduced in the randomized data, then a flag is set which indicates the presence of the preamble portion in the data stream. The method employed within the subroutine block 635 to determine the preamble pattern metric is described in greater detail below with reference to FIG. 11.

The metrics determined within the subroutine blocks 610, 620, 630, 635 serve as inputs to a decision block 640 which determines if any one of the null, phase or amplitude metrics has been exceeded. In one advantageous embodiment, the subroutine blocks 610, 620, 630, 635 simply set flags to indicate that a metric threshold has been exceeded. If any one of the metrics has been exceeded, then a bit is inserted into the data stream to compensate, as represented within a subroutine block 650. However, if it is determined within the decision block 640 that the metric has not been exceeded, then the method returns to the inputs of the subroutine blocks 610, 620, 630, 635. The appropriate metric values are reset at the beginning of each new block of data.

Figure 7:
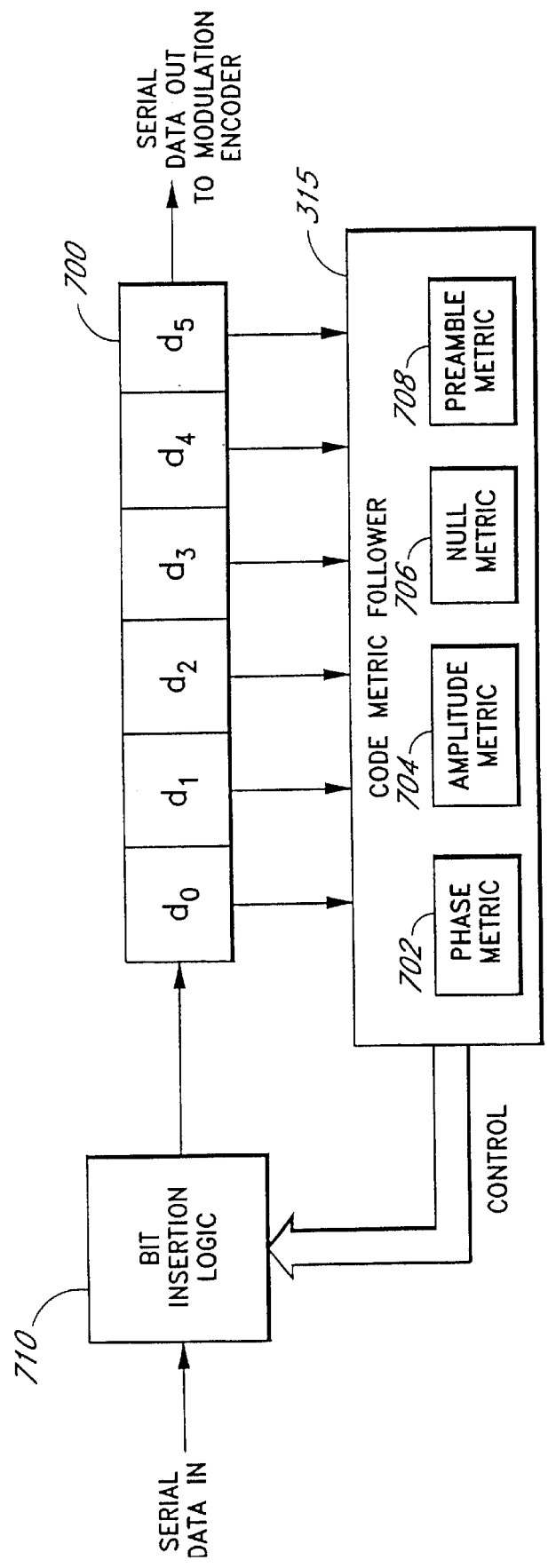
FIG. 7 is a simplified block diagram illustrating the functionality of one embodiment of the bit inserter and code metric follower of FIG. 2.

FIG. 7 is a more detailed view of the functionality of the bit inserter and code metric follower of FIG. 2 in one advantageous embodiment of the invention. As serial data flows through the bit inserter 312, the six most recent bits of the bit stream are analyzed by the code metric follower 315. These six most recent received bits are denoted $d_0$ through $d_5$, with $d_0$ being the most recently received bit, and with $d_5$ being the bit received six bits ago. As serial data is received by the bit inserter, the bits are shifted right in FIG. 7, from $d_0$ to $d_1$, $d_1$ to $d_2$, and so on, with $d_5$ being shifted out and routed to the modulation encoder 104.

With each new bit entering the six bit window 700 and with the associated right shift, the six bits in the window 700 are analyzed by the code metric follower 315, and the content of registers which store the phase metric 702, amplitude metric 704, null metric 706, and preamble metric 708 are updated depending on the polarities of the six bits present in the window 700. If an update to one or more of the metrics 702–708 results in a metric exceeding a predefined threshold, the code metric follower instructs bit insertion logic 710 to insert a bit into the data stream. In this event, the bit insertion logic 710 will shift a new bit into position $d_0$, rather than shifting the next bit of the data to be recorded into position $d_0$. In one advantageous embodiment, the polarity of the inserted bit is determined based on the polarity of the second to last shifted in bit, i.e. the polarity of bit $d_1$. In this embodiment, either a bit of identical polarity, or the inverse polarity of bit $d_1$, is shifted in by the bit insertion logic 710 depending on which of the metrics has exceeded its threshold.

With reference now to FIGS. 8–11, the bit analysis and metric updating procedures for one advantageous embodiment of the invention are described below. In this embodiment, metric updating procedures, comparison thresholds, and the polarity of the inserted bits are chosen to enhance the operation of an Extended Class IV partial response (EPR4) read channel. It will be appreciated, however, that the variable rate encoding principles described herein are applicable to other classes of partial response decoding, as well as to peak detecting read channels. In each case, the metric updating and inserted bits will be tailored to the characteristics of the read channel to be utilized during the subsequent data readback from the medium 108.

Class IV partial response signaling is known to be well suited to magnetic recording. Certain magnetic tape systems are especially suited to the use of the Extended Class IV (EPR4) system, characterized by the polynomial $1+D-D^2-D^3$, wherein "D" denotes the one bit delay operator. With EPR4 signaling, digitizing the analog read signal and discriminating appropriately timed signal amplitude measurements results in a five level output stream (often denoted as +2, +1, 0, −1, −2) which is decoded by the maximum likelihood sequence decoder into a serial output of recorded bits.

It is a characteristic of the EPR4 read channel that strings of consecutive 0s, strings of consecutive 1s, and strings of alternating 1s and 0s (i.e. the string . . . 10101010. . . ) produce minimum read channel response. In these cases, the stream of filtered samples output from the FIR filter 130 of FIG. 1 remain near zero, and accurate sequence decoding is not possible. In contrast, strings of the four bit sequence "0011" produce a maximum read channel response, with the stream of filtered samples output from the FIR filter 130 defining an oscillating signal having a maximum peak to peak swing. Thus, for accurate sequence decoding in an EPR4 read channel, the data stream being read should include bit sequences such as "0011" which produce a large, easily decoded read channel response and should not include lengthy strings of bit sequences associated with small or slowly varying read channel responses. As will be appreciated with examination of FIGS. 8–11, the code follower 315 and the bit insertion performed under its control may be configured to help ensure a stored data sequence which produces an EPR4 read channel response that can be decoded with a low error rate.

Figure 8:
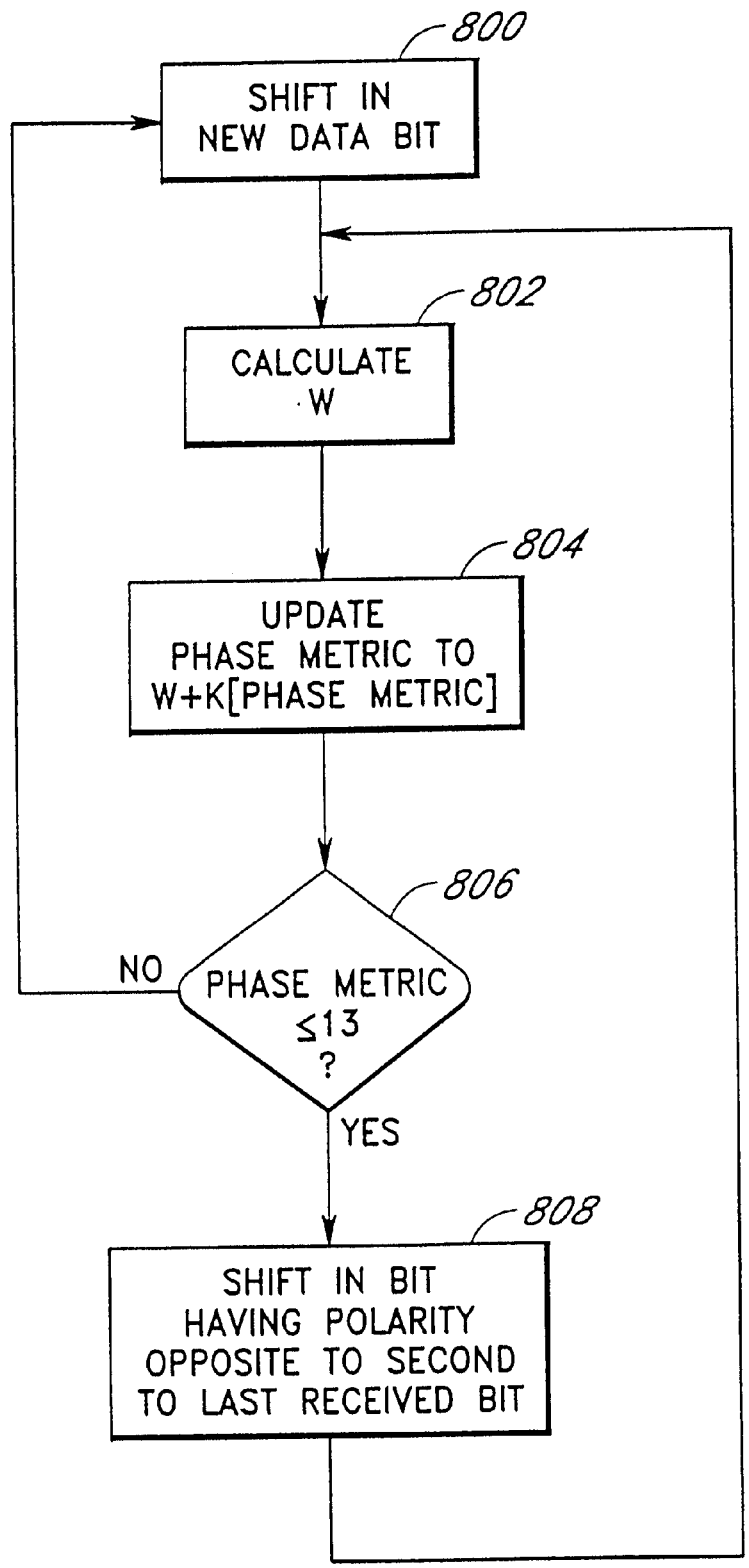
FIG. 8 is a flowchart that illustrates one embodiment of a process utilized to insert bits into data stream regions having low phase information content.

Referring now to FIG. 8, the process for updating the phase metric 702 and inserting a bit in response to this metric is described. The phase metric 702 is a value with a range of decimal 0 to 127. In one embodiment of the invention, the bit insertion function is initiated following the preamble 410 at the start of writing the appropriate randomizer seed 414 and data 420 portions of the block. At this time, the six bit window $d_0$–$d_5$ is initialized with the last four bits of the preamble sequence 410 and the two bit block marker 412 which together comprise the six bits 111100. The phase metric 602 is initialized at this point to a value of decimal 20. When window 700 analysis and metric updating begins at block 800 of FIG. 8, a new data bit is shifted in to position $d_0$. At block 802, an index "W" is calculated based on the six bit values in the window 700. This index is advantageously calculated with the following formula:

$$W = *4(d_2+d_3) - 2(d_0+d_1+d_4+d_5)*$$

This index W will vary from 0 to a maximum of 8, with the maximum occurring when the polarities of the center bit pair $d_2$ and $d_3$ are the same, and are different from the polarities of all of the edge bit pairs $d_0$, $d_1$, and $d_4$, $d_5$. Thus, adjacent bit pairs of "00" and "11" in the data stream (which are associated with large and rapid swings in read signal amplitude in an EPR4 read channel and thus include a large amount of phase information) will tend to produce larger index values. In contrast, a high proportion of "0101" and other bit sequences associated with slowly varying read channel responses in an EPR4 read channel and consequent low phase content in this environment will tend to produce smaller index values.

Next, at block 804, the phase metric 802 is updated by multiplying the current phase metric value by a scaling factor K, which may advantageously comprise a constant 60/64, and then adding the index W calculated from the six bit window according to the above formula. It can be appreciated that if the index W is less than 60/64 of the current phase metric, the phase metric will be reduced by this calculation. If the index W is greater than 60/64 of the current phase metric, then the phase metric is increased by this calculation.

At decision block 806, the updated phase metric is compared to a threshold value, which may in this embodiment be advantageously selected to be decimal 13, although other values may also be suitable. If the updated phase metric is greater than 13, the system returns to block 800, and the next new data bit is shifted into position $d_0$. If the phase metric is less than or equal to 13, the system moves to block 808, and a bit which has polarity opposite to the second to last data bit received (i.e., the inverse of bit $d_1$) is shifted in instead of the next data bit. Whether the next bit shifted into position $d_0$ is the next bit of the data stream or is an inserted bit having polarity opposite to that of bit $d_1$, the system resumes with the calculation of the index W and the updating of the phase metric using the six bit window 700 as modified by the shifted in bit.

Figure 9:
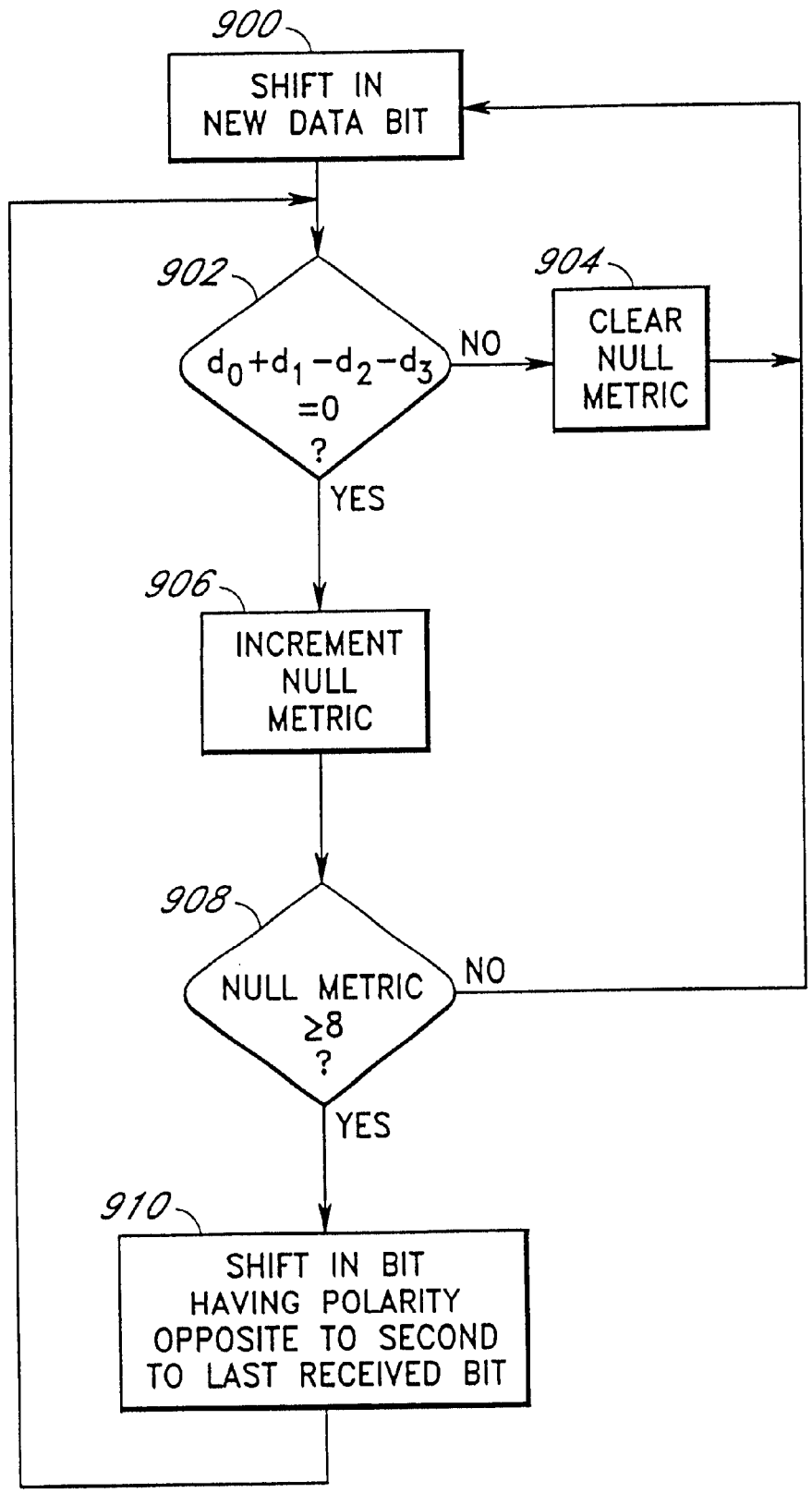
FIG. 9 is a flowchart that illustrates one embodiment of a process utilized to insert bits into data stream regions containing a null string.

FIG. 9 illustrates the process of updating the null metric 706 and inserting bits into the bit stream being recorded in response to the null metric 706 value. As described above, the initial state of the bit window 700 when beginning bit insertion is 111100, and at this point in block processing, the null metric is set to one. The null metric calculation begins at block 900, with the shifting in of the first bit of the data stream. The system then moves to decision block 902 where the first four bits of the six bit window are analyzed by the code metric follower 315 to determine if the bits $d_0$, $d_1$, $d_2$, and $d_3$ satisfy the relation:

$$d_0+d_1=d_2+d_3$$

If this relation is not satisfied (indicating that the four bits $d_0$ through $d_3$ do not comprise sequences 0000, 1111, 0101, or 1010, the system moves to block 904, and the null metric is cleared to zero. The system then loops back to block 900 and the next bit from the data stream is shifted into position $d_0$. If the relation is satisfied, indicating that the four bits $d_0$ through $d_3$ comprise 0000, 1111, 0101, or 1010, the system moves to block 906, and the null metric is incremented by one. Following the incrementing of the null metric at block 906, the system moves to a second decision state 908, where the null metric is compared to a threshold, which may advantageously be set to 8. If the null metric is less than eight, the system again loops back to block 900, and the next bit from the data stream is shifted in to position $d_0$. If, however, the null metric has been incremented to eight with the last bit, the system moves to block 910, and a bit which has polarity opposite to the second to last data bit received (i.e., the inverse of bit $d_1$) is shifted in instead of the next data bit. Whether the next bit shifted into position $d_0$ is the next bit of the data stream or is an inserted bit having polarity opposite to that of bit $d_1$, the system again evaluates the six bit window 700 as modified by the shifted in bit.

Figure 10:
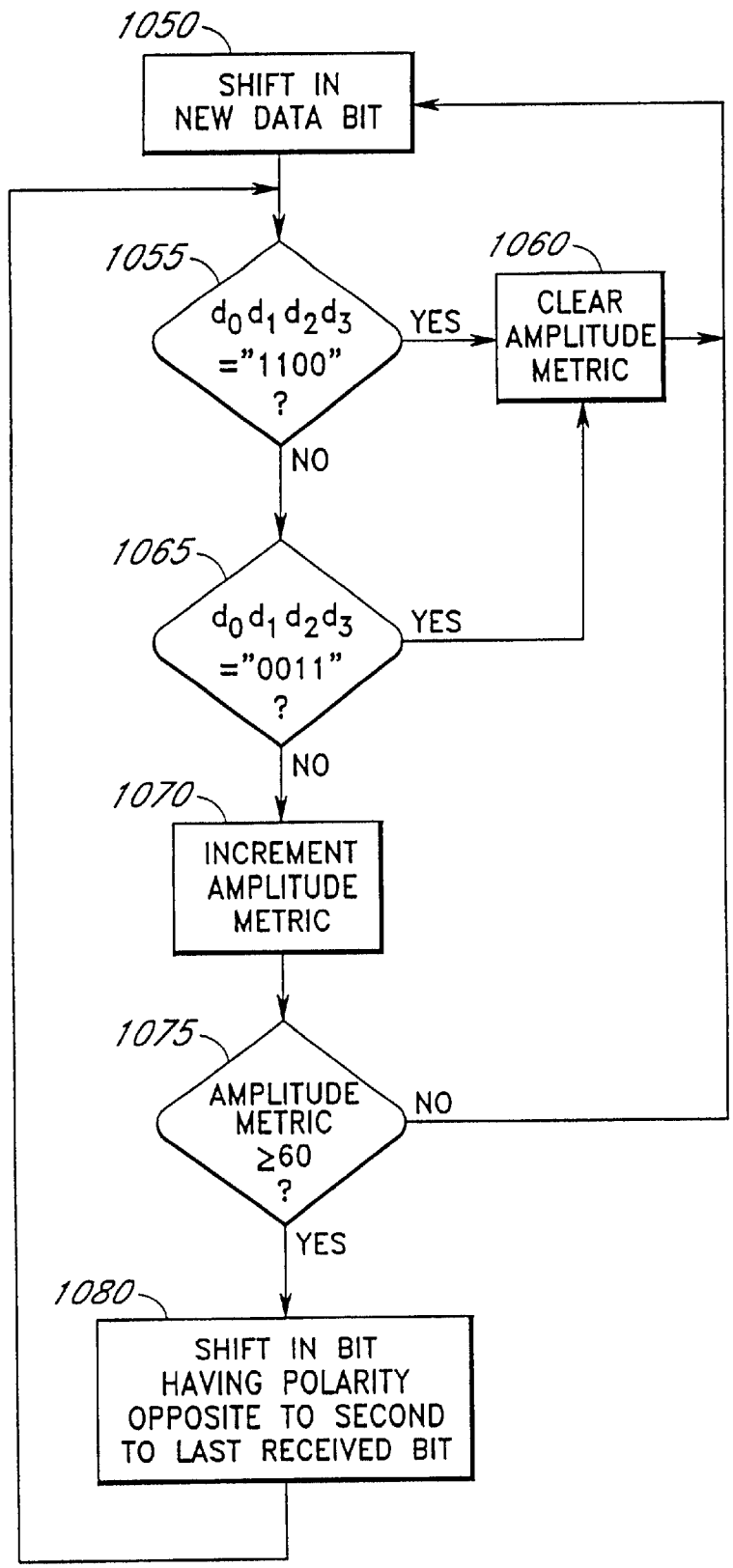
FIG. 10 is a flowchart that illustrates one embodiment of a process utilized to insert bits into data stream regions having low amplitude content.

Referring now to FIG. 10, the process of updating the amplitude metric and the insertion of bits into the data stream in response thereto is shown. As with FIGS. 8 and 9, the system begins at block 1050, where a bit of the data stream is shifted into position $d_0$. As before, if this is the first bit following the preamble 410 and the block marker 412, the six bit window 700 contains the string 111100, and the amplitude metric is initialized to decimal 2. As mentioned above, in an EPR4 read channel, the bit sequences 0011 and 1100 produce a positive or negative read signal swing of maximum amplitude. Accordingly, the code metric follower 315 may also advantageously be configured to test the data stream for these sequences.

This is shown in FIG. 10 at block 1055, where the code metric follower compares the four bits $d_0d_1d_2d_3$ to the bit sequence 1100. If these four bits are equal to this bit sequence, the amplitude metric is cleared at block 1060, and the system loops back to block 1050 to shift in the next bit of the data stream. If the bits $d_0$ to $d_3$ are not 1100, the system moves to decision block 1065, where the same four bits are compared to the bit sequence 0011. If these four bits are equal to 0011, the amplitude metric is again cleared at block 1060, and the system loops back to block 1050 to shift in the next bit of the data stream.

If the bits $d_0$ through $d_3$ are neither 1100 nor 0011, the system continues to block 1070, and increments the amplitude metric by one. The system then enters the decision block 1075 and compares the amplitude metric to a threshold value which may be set to, for example, 60. If the amplitude metric is less than 60, the system again loops back up to block 1050 and shifts a new bit from the data stream into position $d_0$. If, however, the amplitude metric has been incremented to 60 with the last bit, the system moves to block 1080 and a bit which has polarity opposite to the second to last data bit received (i.e., the inverse of bit $d_1$) is shifted in instead of the next data bit. As with the phase and null metric update processes described above, whether the next bit shifted into position $d_0$ is the next bit of the data stream or is an inserted bit having polarity opposite to that of bit $d_1$, the system resumes by again evaluating the content of the six bit window 700 as modified by the shifted in bit. It may be noted that regardless of the state of bits $d_0$ to $d_3$ when the amplitude metric reaches 60, sequential shifts into $d_0$ of the inverse bit $d_1$ will insert either a 0011 or a 1100 sequence into the data stream with the insertion of at most three bits.

Figure 11:
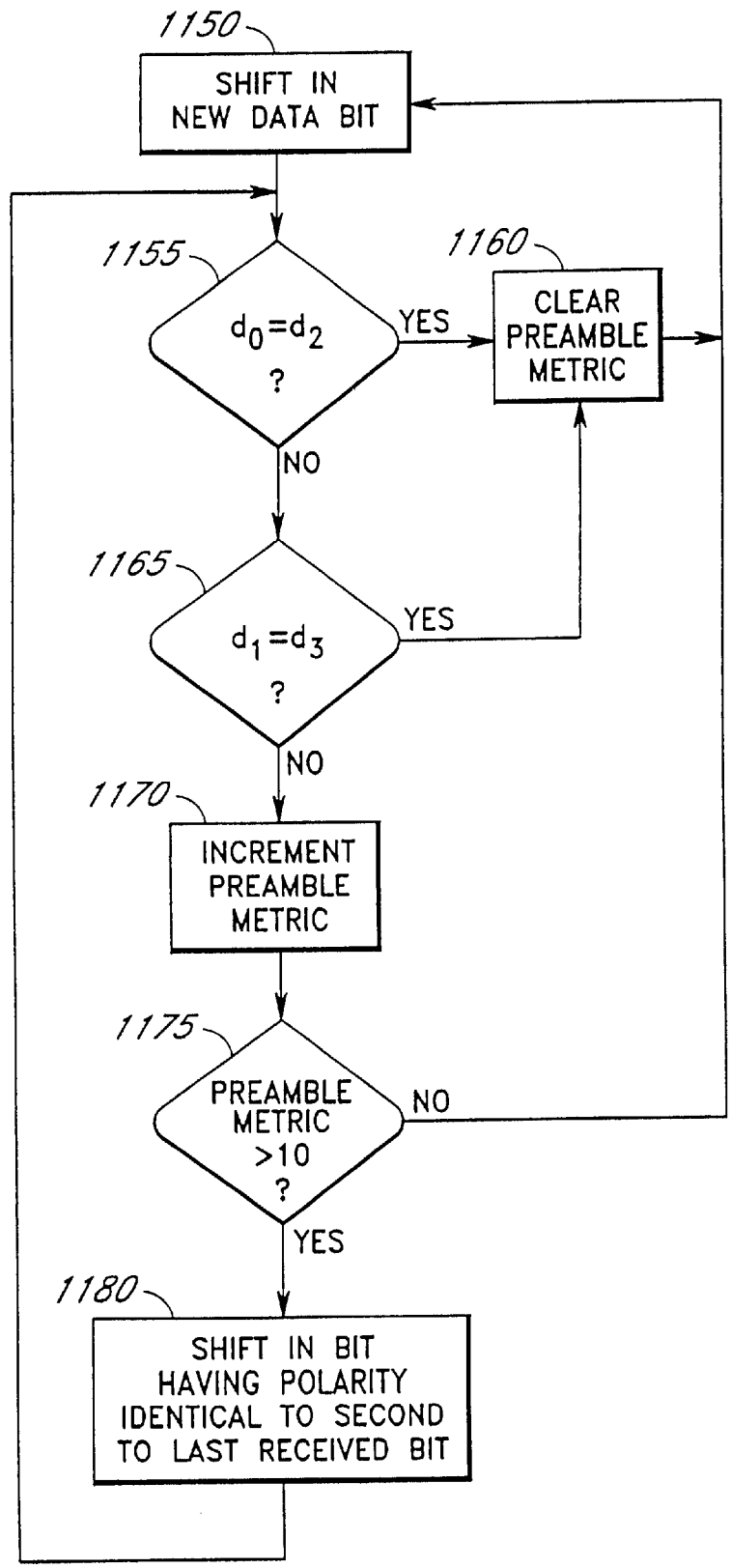
FIG. 11 is a flowchart that illustrates one embodiment of a process utilized to insert bits into data stream regions having a portion of a preamble sequence.

FIG. 11 illustrates the updating of the preamble metric 708 and the bit insertion performed in response thereto. The initial state at block 1150 of FIG. 11 is identical to that described above with reference to FIGS. 8–10. A bit of the data stream is shifted into position $d_0$, and if this is the first bit following the preamble 410 and the block marker 412, the six bit window 700 contains the string 111100 immediately prior to this shift of the first data bit. The preamble metric is cleared to zero at this point in block processing. At step 1155, the code metric follower 315 compares the bits $d_0$ and $d_2$. If these bits are equal, the three bits in positions $d_0$ through $d_2$ must be either 101, 010, 000, or 111, none of which are present in the preamble portion 410 of the data block described above. In this case, the system moves to step 1160, clears the preamble metric, and the next bit from the data stream is inserted as the system loops back to block 1150.

If bits $d_0$ and $d_2$ are not equal, at block 1165 the system compares bits $d_1$ and $d_3$. If these bits are equal, the system again moves to block 1160, clears the preamble metric, and loops back to block 1150 to shift in the next data bit. If, however, bits $d_1$ and $d_3$ are also not equal, the content of bits $d_0$ through $d_3$ must be a bit sequence which matches a portion of the preamble 410. In this case, the system advances to block 1170, and the preamble metric is incremented by one. Next, at block 1175, the preamble metric is compared to a threshold, which may be set to 10. If the preamble metric is equal to or less than 10, the system again loops back to block 1150, and the next new data bit is shifted in. If the preamble metric has been incremented to 11 with the last bit shifted in, the system moves to block 1180, and a bit having a polarity equal to he second to last shifted in bit (i.e., bit $d_1$) is shifted into position $d_0$. It will be appreciated that although inserting the inverse of bit $d_1$ (the insertion method used for the phase, null, and amplitude metrics) will tend to insert 1100 and 0011 sequences into the data stream, inserting a bit identical to bit $d_1$ will break any string of such sequences which produce a significant portion of a preamble pattern in the data field 420 of the block. Following bit insertion, the system continues by again evaluating $d_0$ and $d_2$ at block 1155 using the updated content of the six bit window 700.

Embodiments of the invention thus provide a highly efficient randomization and variable rate coding scheme for use with data storage on magnetic media. The invention is applicable to many types of media including magnetic disk and tape. The variable rate coding system described above produces a (0,k) run length limited code (with k=11 in the specific embodiment described above) readable with a low bit error rate in a storage system using a partial response read channel.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the present invention should not be taken to imply that the terminology is being re-defined herein to be restricted to including any specific characteristics of the features or aspects of the invention with which that terminology is associated. The scope of the present invention should therefore be construed in accordance with the appended Claims and any equivalents thereof.

What is claimed is:

1. A method of writing data to a data storage medium comprising:
   receiving an input data stream;
   detecting one or more bit sequences in said input data stream associated with a small amplitude read response;
   inserting one or more bits into said input data stream in response to said detection, whereby said inserted bits extend the length of said input data stream by a variable amount which depends on said input data stream content; and
   writing said data stream, including said inserted bits, to said data storage medium.

2. The method of claim 1, wherein said one or more bits are inserted after detecting the presence of a bit sequence associated with a small amplitude read signal.

3. The method of claim 2, wherein said detecting step comprises detecting strings of 0s.

4. The method of claim 2, wherein said detecting step comprises detecting strings of 1s.

5. The method of claim 2, wherein said detecting step comprises detecting strings of a plurality of copies of the two bit word 01.

6. The method of claim 2, wherein said detecting step comprises simultaneously detecting strings of 0s, strings of 1s, and strings of a plurality of copies of the two bit word 01.

7. The method of claim 2, wherein said detecting step comprises evaluating the content of a plurality of previously received bits of said input data stream.

8. The method of claim 7, wherein said detecting step comprises evaluating the content of the most recent four bits of said input data stream.

9. A method of writing data to a data storage medium comprising:
receiving an input data stream;
detecting one or more bit sequences in said input data stream associated with a slowly varying read response;
inserting one or more bits into said input data stream in response to said detection, whereby said inserted bits extend the length of said input data stream by a variable amount which depends on said input data stream content; and
writing said data stream, including said inserted bits, to said data storage medium.

10. The method of claim 9, wherein said detecting step comprises evaluating the content of a plurality of previously received bits of said input data stream.

11. The method of claim 10, wherein said plurality of bits comprises the most recent six bits of said input data stream.

12. A method of writing data to a data storage medium comprising:
receiving an input data stream;
monitoring said input data stream for the presence of one or more bit sequences in said input data stream associated with a maximum amplitude read response;
inserting one or more bits into said input data stream in response to said monitoring, whereby said inserted bits extend the length of said input data stream by a variable amount which depends on said input data stream content; and
writing said data stream, including said inserted bits, to said data storage medium.

13. The method of claim 12, wherein said one or more bits are inserted after detecting the absence of a bit sequence associated with a maximum amplitude read signal in a selected number of bits.

14. The method of claim 13, wherein said monitoring step comprises detecting the bit sequences 1100 and 0011.

15. The method of claim 14, wherein said selected number of bits is approximately 60.

16. The method of claim 13, wherein said monitoring step comprises evaluating the content of a plurality of previously received bits of said input data stream.

17. The method of claim 16, wherein said monitoring step comprises evaluating the content of the most recent four bits of said input data stream.

18. A method of writing data to a data storage medium comprising:
receiving an input data stream;
detecting one or more bit sequences in said input data stream associated with a data block preamble sequence;
inserting one or more bits into said input data stream in response to said detection, whereby said inserted bits extend the length of said input data stream by a variable amount which depends on said input data stream content; and
writing said data stream including said inserted bits to said data storage medium.

19. The method of claim 18, wherein said one or more bits are inserted after detecting the presence of a bit sequence associated with a data block preamble sequence.

20. The method of claim 19, wherein said detecting step comprises detecting strings comprising alternating 00 and 11 bit pairs.

21. The method of claim 19, wherein said detecting step comprises evaluating the content of a plurality of previously received bits of said input data stream.

22. The method of claim 21, wherein said detecting step comprises evaluating the content of the most recent four bits of said input data stream.

23. A method of writing data to a data storage medium comprising:
receiving an input data stream;
detecting one or more bit sequences in said input data stream associated with a small amplitude read response;
detecting one or more bit sequences in said input data stream associated with a slowly varying read response;
inserting one or more bits into said input data stream in response to said detection, whereby said inserted bits extend the length of said input data stream by a variable amount which depends on said input data stream content; and
writing said data stream, including said inserted bits, to said data storage medium.

24. The method of claim 23, additionally comprising detecting one or more bit sequences in said input data stream associated with a maximum amplitude read signal during readback of said data stream from said data storage medium.

25. The method of claim 24, additionally comprising detecting one or more bit sequences in said input data stream associated with a data block preamble sequence.

26. A method of storing a series of data blocks comprising:
randomizing a first data block of n bits using a first randomizer seed to produce a first randomized data block of n bits;
inserting a variable number of bits into said first randomized data block, the number and location of said variable number of bits being dependent on the bit sequence of said n bits so as to produce a randomized and encoded data block of m bits;
non-deterministically selecting a second randomizer seed;
randomizing a second data block of n bits using said second randomizer seed to produce a second randomized data block of n bits;
inserting a variable number of bits into said second randomized data block, the number and location of said variable number of bits being dependent on the bit sequence of said n bits so as to produce a second randomized and encoded data block of p bits, with p being different from m; and
storing said first and second randomized and encoded data blocks onto a data storage medium.

27. A method of encoding digital data comprising:
randomizing a series of data blocks with a series of non-deterministically selected randomizer seeds to produce a series of randomized data blocks; and
inserting a variable number of bits into said series of randomized data blocks to produce a series of encoded randomized data blocks.

28. The method of claim 27, wherein an average block extension produced by said inserting is less than approximately 1%.

29. The method of claim 27, wherein said inserting step satisfies a (0,k) run length limited code constraint.

* * * * *